United States Patent Office 3,272,670

Patented Sept. 13, 1966

3,272,670

TWO-STABLE, HIGH-RESOLUTION ELECTRON-ACTUATED RESISTS

Robert E. Myers, Menlo Park, Calif., assignor to Stanford Research Institute, Menlo Park, Calif., a corporation of California No Drawing. Filed Aug. 27, 1965, Ser. No. 483,326
5 Claims. (Cl. 156—13)

This invention relates to the manufacture of microelectronic devices using micromachining and more particularly to improvements in micromachining processes and materials.

In the manufacture of microelectronic devices by micromachining techniques, it is desirable to be able to etch sharply defined microscopic patterns on thin films such as molybdenum or aluminum oxide. The present technique employed is to use photoresist materials which are exposed to light patterns and then to some type of etchant which removes the photoresist material from those regions which are not affected by the light pattern. However, it has been found that the resolving power of presently-available photoresists is limited to the micron region by the wavelength of the exposing light, the particle size and the thickness of the emulsion formed from aqueous suspensions.

In order to overcome the shortcomings of light activated resists and to achieve higher degrees of resolution, investigation has been made into electron beam activation of resists. However, materials, and more especially solid materials, which retain the necessary properties and which behave properly in the environmental conditions present during deposition of these materials and before and during electron beam activation have not yet been found.

An object of the present invention is the provision of a resist material that can be activated by an electron beam and that is stable under environmental conditions which occur in such apparatus.

Yet another object of the present invention is the provision of electron beam activated resist material which has a low enough vapor pressure so that it can be stored for several hours in a high vacuum system before being exposed.

Still another object of the present invention is the provision of an electron beam activated resist material which is simply removable in those regions where they are not activated by an electron beam.

Another object of the present invention is the provision of a novel electron beam activated resist material which is a solid stable enough to resist decomposition even during vacuum deposition.

Yet another object of this invention is the provision of an improved method and means of micromachining.

These and other objects of the present invention may be achieved by using resist materials whose basic structure is modified by an electron beam. Two such materials are tetrakistriphenylsiloxytitanium $$([(C_6H_5)_3SiO]_4Ti)$$

and tetrakistriphenylsiloxysilane ($[(C_6H_5)_3SiO]_4Si$). These materials after being activated resist the attack of such etchants as sulfuric acid, chlorine, and phosgene. Yet the portions of the resist which are not activated by the electron beam may be easily removed and the underlying film etched by various aqueous etchants and electropolishing solutions, as well as by molecular beam etching at elevated temperatures in vacuum. Illustrative of some suitable etchants are ($H_3PO_4$) which can also etch aluminum oxide films, a sulfuric acid-alcohol electropolish for molybdenum. Sodium hydroxied aqueous etch for aluminum or a chloride or oxygen molecular beam etch for molybdenum.

Using the following techniques, resolving powers of less than 300 angstroms have been obtained. A substrate-supported film, such as aluminum oxide which was to be etched to a specific pattern, was first coated with a 200 angstrom layer of an electron resist material by vacuum deposition from a resistance heated container. Both resist materials, in accordance with this invention, were tried. A suitable mask, made of ¼ micron polystyrene spheres was laid down by spraying a suspension of these spheres in a fluid such as water, from a neblizer, and the resist film was exposed for several seconds to an electron flood beam having a voltage higher than 300 volts (typically 2 kv.), and having a current density of one milliampere per square centimeter. Alternatively, the mask may be scanned by a suitably small diameter electron beam having the same energy range as the flood beam. The basic structure of the resist was altered to a glassy etch-resistant surface wherever the surface was exposed to the electrons.

The mask, consisting of polystyrene spheres, is removed by coating the surface with cellulose acetate cement, such as the type made by the DuPont Company and sold under the name "Duco." The dried film containing the spheres is then peeled away without disturbing the resist. The unexposed resist was then removed by dissolving it in a solution of acetone or benzene. The remaining film was heat treated by baking the substrate for five minutes at 600 to 900° C. The areas of the aluminum oxide film which is now not covered by the resist is etched away by an aqueous etchant, such as 85% orthophosphoric acid ($H_3PO_4$) at 95° C.

The resist material which remained resisted the attacks of such etchants as sulfuric acid, chlorine, phosgene and orthophosphoric acid.

If the intended application of the etched films requires it, the remaining thin resist layer may be removed by lightly heating the substrate in the presence of a molecular beam of ammonuim bifluoride. It timed carefully, the thicker underlying film is not appreciably attacked.

It has been found that the orthophosphoric acid can etch sub-micron cavities in aluminum oxide thin films leaving the resist unaffected. For example, the etching rate for 85% ($H_3PO_4$) at 100° C. was found to be approximately ½ micron per minute. No resist deterioration was observed at this temperature with runs lasting over three minutes. Molybdenum films have been immersed in orthophosphoric acid at 100° C. for over one hour with no noticeable effect. This makes it possible to etch through aluminum oxide films without danger to underlying molybdenum film.

In accordance with this invention, there have been described materials with which it is possible to obtain a higher resolution resist material than has ever been achieved heretofore.

What is claimed is:

1. The method of producing a microscopic pattern on a thin metal or metal oxide film comprising depositing on said film a covering film of one of the materials selected from the group consisting of tetrakistriphenylsiloxytitanium and tetrakistriphenylsiloxysilane, bombarding predetermined regions of said covering film with electrons having an energy sufficient to alter the structure of the covering film wherever they impinge to a glassy etch resistant surface, removing those portions of the covering film which have not been bombarded heating the portions of said covering film which are not removed over a predetermined interval at a predetermined temperature and thereafter etching the exposed thin film.

2. The method of producing a microscopic pattern on a thin film as recited in claim 1 wherein said unexposed covering film is removed by one of the solutions selected from the group consisting of acetone and benzene.

3. The method of producing a microscopic pattern on a thin metal or metal oxide film comprising depositing on said film a covering film of one of the materials selected from the group consisting of tetrakistriphenylsiloxytitanium and tetrakistriphenylsiloxysilane, placing a polystyrene mask with predetermined openings therethrough over said covering film, bombarding said covering film through the openings in said mask with electrons having an energy sufficient to alter the structure of said covering film wherever said electrons impinge to a glassy etch resistant surface, removing said mask, removing those portions of the covering film which have not been bombarded, heating the portions of said covering film which have not been removed at a temperature between 500 to 900° C. over an interval on the order of five minutes, and thereafter etching the portions of said thin film which no longer have a covering film thereon.

4. The method as recited in claim 3 wherein said thin film is aluminum oxide and the etching thereof is done with orthophosphoric acid ($H_3PO_4$) at a predetermined temperature for a predetermined time.

5. The method as recited in claim 3 wherein said step of placing a polystyrene mask with predetermined openings therethrough over said covering film comprises placing over said covering film a mask having openings therethrough covering those regions of said covering film which it is not desired to bombard with electrons, spraying said covering film through the openings of said mask with an aqueous solution of polystyrene spheres, and removing said mask.

References Cited by the Examiner

UNITED STATES PATENTS

| | | | |
|---|---|---|---|
| 2,904,481 | 9/1959 | Lawton et al. | 117—93.31 X |
| 3,122,463 | 2/1964 | Ligenza et al. | 156—17 X |

ALEXANDER WYMAN, *Primary Examiner.*

JACOB H. STEINBERG, *Examiner.*